United States Patent [19]
Woodman, Jr.

[11] Patent Number: 5,568,097
[45] Date of Patent: Oct. 22, 1996

[54] ULTRA HIGH AVAILABILITY CLOCK CHIP

[75] Inventor: Gil R. Woodman, Jr., San Jose, Calif.

[73] Assignee: International Business Machines Inc., San Jose, Calif.

[21] Appl. No.: 533,367

[22] Filed: Sep. 25, 1995

[51] Int. Cl.$^6$ .............................. H03B 28/00; H03L 7/00; H03L 7/07
[52] U.S. Cl. ................................ 331/2; 331/1 A; 331/18; 331/46; 331/74; 327/147; 327/292; 327/298
[58] Field of Search .................................. 331/1 A, 2, 14, 331/18, 44, 46, 49, 56, 64, 74, 175; 327/99, 144, 147–150, 292, 298

[56] References Cited

U.S. PATENT DOCUMENTS

| | | |
|---|---|---|
| 3,900,741 | 8/1975 | Fletcher et al. . |
| 4,322,580 | 3/1982 | Kahn et al. . |
| 4,538,272 | 8/1985 | Edwards et al. . |
| 4,644,498 | 2/1987 | Bedard et al. . |
| 4,653,054 | 3/1987 | Liu et al. . |
| 4,683,570 | 7/1987 | Bedard et al. . |
| 4,788,670 | 11/1988 | Hofmann et al. . |
| 4,839,855 | 6/1989 | Van Driel . |
| 4,979,191 | 12/1990 | Bond et al. . |
| 4,984,241 | 1/1991 | Truong . |
| 5,117,442 | 5/1992 | Hall ......................................... 375/107 |
| 5,231,389 | 7/1993 | Yamauchi ............................ 331/46 X |
| 5,260,979 | 11/1993 | Parker et al. . |
| 5,289,138 | 2/1994 | Wang . |
| 5,406,231 | 4/1995 | Jylhä ........................................ 331/49 |
| 5,422,915 | 6/1995 | Byers et al. ........................... 331/49 X |

FOREIGN PATENT DOCUMENTS

| | | |
|---|---|---|
| 94/18624 | 8/1994 | WIPO . |

OTHER PUBLICATIONS

S. W. Salisbury, "Single–Clock Module Test Provision For A Fault–Tolerant Clock System," *IBM Technical Disclosure Bulletin*, vol. 35, No. 4A, Sep. 1992, pp. 383–384.

K. R. Griess and S. W. Salisbury, "Glitchless Oscillator Switch For High Reliability," *IBM Technical Disclosure Bulletin*, vol. 34, No. 2, Jul. 1991, pp. 55–58.

*Primary Examiner*—David Mis
*Attorney, Agent, or Firm*—Merchant, Gould, Smith, Edell, Welter & Schmidt, P.A.

[57] ABSTRACT

A single reliable clock source that can be shared by all cards in a multiple card assembly. The clock delivers synchronous clock signals, so that there is no longer a need to provide crystal oscillators on each card, instead, a single non-interruptable clock source is shared by all cards. The clock is an Application Specific Integrated Circuit (ASIC), where single sources of failure have been removed by using redundant connection and majority logic. Thus, a plurality of selection means are redundantly coupled to receivers for selecting an oscillator signal to provide to phase-locked oscillators. Further, majority logic voters are redundantly coupled to the phase-locked oscillator to provide a clock output signal reflecting the state of the majority of the phase-locked oscillator signals. The clock includes three independent crystal oscillators, one clock ASIC, the wire and connectors which deliver the signals, and a 2×3 AND-OR majority logic on the receiving card. Each customer of the clock ASIC receives three signals from the clock ASIC and votes the three signals to create a local clock. Thus, failures at individual points do not prevent the delivery of the clock signal.

18 Claims, 3 Drawing Sheets

ULTRA HIGH AVAILABILITY CLOCK CHIP

BACKGROUND OF THE INVENTION

1. Field of the Invention

The invention relates in general to a data processing device, and more particularly, to an ultra high availability clock chip for use by multiple, synchronized card assemblies.

2. Description of Related Art

High availability File Servers and control units of redundant (RAD) disk drive sets, as well as massively parallel processor arrays are pushing into the practical barrier of cost control. Multiple card assemblies that must work together quite often have been assembled with independent clock sources on each card. In some configurations, synchronous operation of the card set is an advantage to the assembled function, so that inventive solutions have been found to provide independent clock sources that would also work synchronously. However, faults in any of the clock channels may seriously impact the synchronization of the other clock sources, and thus undermine the operation of the entire system.

A clock channel fault may comprise an intermittent connection, a shift in the frequency of one of the clock channels due to environmental effects, or a component failure in the circuitry of one of the clock channels. In the worst case, one of the clock channels may fail completely, effectively terminating operation of the system to which it is connected as a time base.

Nevertheless, it is possible to partition the functions on a single ASIC in a way that makes the function it performs immune to virtually all forms of single failures, and many forms of double failures that can occur. The concepts used are redundant connections, and majority logic.

Redundant connections implies that each signal, power, ground, are all connected to the chip through several pins. The power and ground connections on the chip are made through a matrix of wires. The output signals are delivered to each customer card through several independent wires.

Majority logic is the concept of requiring at least three signals, any two of which (out of three) are required to satisfy the function. The simplest form of majority logic is a 2×3 AND-OR combination, that is three two way ANDs that are ORed together. Logically, if any two signals are 'true' at the same time, the function is satisfied and a 'true' is propagated. For example, a crystal oscillator input on the ASIC would be received through three pins, two of which had to agree, or the signal would be ignored.

Clearly, it is desirable to provide a redundant clock system that is able to tolerate a limited number of faults without loss of synchronization of the clock channels that continue to operate properly.

One technique for achieving fault tolerance is modular redundancy. Redundancy at component level, i.e. interdependent multiple clock channels within a circuit, rather than at system level is needed to obtain the required reliability. In a fault tolerant computing system that comprises multiple processors operating in lockstep using redundant clocks, the clocks must be synchronized in order for the computing system to be able to effectively compare data and mask out faults. A fault tolerant clock must be extremely reliable to meet the reliability requirement for its host fault tolerant computer. To maintain the synchronization and reliability of the clock it is important that the design be simple and require a minimal number of components.

Using the redundancy principles discussed above, a fault tolerant clock typically has three or more clock channels each comprising an oscillator having a feedback path that contains a majority voter to tolerate a single fault. The majority voter receives the outputs of all channels and provides a clock output signal that reflects the state of the majority of the channel outputs.

In the most common form of modular redundancy, three identical processors or machines are employed in a triple modular redundancy (TMR) configuration in which the processors work synchronously on the same task and their outputs are voted by hardware or software to provide a majority answer. For reliability and efficiency, real time clocking of the processors is preferably provided by employing a fault-tolerant hardware clock system comprising three redundant synchronized clock circuits and a majority voter to permit continued correct system operation with the loss of less than a majority of the clock circuits. This is possible because of the masking action of the majority voter. However, in a triple modular redundancy (TMR) system, if one clock circuit fails the system cannot tolerate a second failure.

The failure rate of a single ASIC (Application Specific Integrated Circuit) is normally calculated for the case of any single failure of any element that is used to create it. If anything breaks, it is considered a total failure event. Each chip I/O circuit, wire, module pin, etc. could be the source of the failure. About the best that any commercial has achieved is on the order of $10^6$ failures per 1000 power on hours.

It can seen then that there is a need for a single noninterruptable clock source to reduce system cost without reducing system availability.

It can also be seen that there is a need for an ultra high availability clock chip for use by multiple, synchronized card assemblies.

SUMMARY OF THE INVENTION

To overcome the limitations in the prior art described above, and to overcome other limitations that will become apparent upon reading and understanding the present specification, the present invention discloses an ultra high availability clock chip.

The present invention solves the above-described problems by providing an ultra high availability clock chip for use by multiple, synchronized card assemblies such as a redundant array of independent disks (RAID) system or a massively parallel processor array.

A system in accordance with the principles of the present invention comprises a plurality of crystal oscillators for providing a plurality of clock signals, a plurality of receivers receiving a clock signal from a crystal oscillator, a plurality of selectors redundantly coupled to each receiver and each selector selecting one of the clock signals as a reference oscillator signal, a plurality of phase-locked loop oscillators for receiving a selected reference oscillator signal from a selector and providing a phase-locked clock signal in response thereto, and at least one majority logic voter redundantly coupled to each phase-locked loop oscillator for providing a clock output signal reflecting the state of the majority of the phase-locked clock signals. Drivers are coupled to the majority logic voting means for receiving the clock output signal and providing three synchronized clock signals to a card assembly in response. A majority voter interface is coupled between the card assembly and the driver means for receiving the three synchronized clock signals from the driver means and providing a local card clock signal for the card assembly.

The clock delivers synchronous clock signals so that there is no longer a need to provide crystal oscillators on each card. Instead, a single non-interruptable clock source is shared by all cards. The clock function is performed by the assembly of three independent packaged crystal oscillators and one ASIC, the connections to deliver the signals, and a 2×3 AND-OR on the receiving card. A clock chip according to the present invention provides improved cost and availability by providing a single extremely reliable (available) clock source that can be shared by all cards in the system, and as such delivers synchronous clock signals. Cost considerations are improved since crystal oscillators are not required in each card.

Additional cost savings results from not having to write recovery micro-code that is required in systems using a spared oscillator structure. Availability is improved by providing a single, non interruptable clock source that is shared by all cards.

one aspect of the present invention is that a single low cost clock ASIC is designed to achieve a failure rate of $10^{18}$ failures per 1000 hours of use, including protection of the delivered clock signals.

Another aspect of the present invention is that a clock ASIC is provided which has a failure rate that is low enough to allow the placement of the clock chip on the back plane of the system, and to never expect to see one field failure for the life of the product.

Another aspect of the present invention is that clock failures during the lifetime of a product can be eliminated.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a single noninterruptable clock source which reduces cost without reducing system availability.

Figure 1:
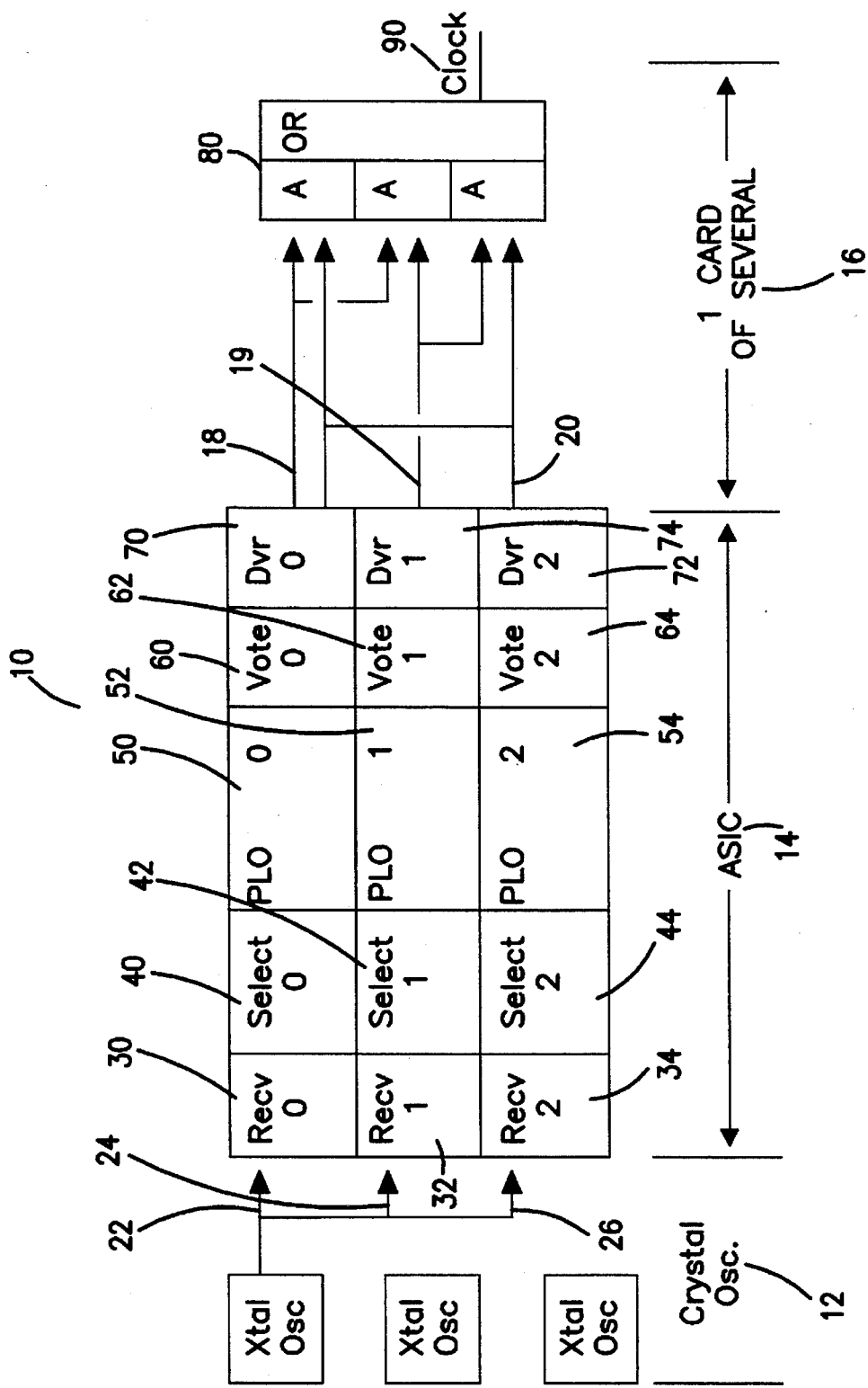
FIG. 1 is a system block diagram of the invention.

FIG. 1 illustrates an exemplary system block diagram 10 according to the present invention. The clock system is partitioned into a group of three independent crystal oscillators 12 and one clock ASIC 14, in a central location, that supplies a plurality of system member cards 16 with three clock signals each 18, 19, 20. Regarding the central location, the crystal oscillator 12 and ASIC clock 14 is merely positioned relative to the member cards 16 so that the clock source 12, 14 itself does not need to be powered down in the event a member card 16 must be replaced.

Three crystal oscillators 12 provide three inputs each 22, 24, 26 to an ASIC 14 that is partitioned into a five by three matrix of functions. The three oscillators 12 are provided in order that there will always be one oscillator 12 remaining in operation that can be selected. Three receivers 30, 32, 34 are used for receiving the signals from each of three crystal oscillators 12. Thus, the signals from the three crystal oscillators 12 are received through nine receivers (Receivers 3–8 not shown in FIG. 1). The receiving function of the oscillators 12 is performed in a redundant fashion so that no single ASIC receiver circuit failure will stop the ASIC 14 from using an operational oscillator 12.

Selection logic selects one of the three received crystal oscillators. Each selection logic section 40, 42, 44 then gets an independent copy of the crystal signal that no one broken receiver 30, 32, 34 could stop. In fact there could be three broken receivers, one on each crystal oscillator, and all signals would still be provided to the selection logic 40, 42, 44. The selection logic sections 40, 42, 44 consist of simple instrumentation to verify the oscillator signal is moving, and to perform a prioritized choice. The signal choice from the selection logic is then put through majority voting logic with choices produced by the two neighbor selectors (see FIG. 2). Thus, the three received signals from one oscillator are then majority voted three times.

Thereafter one of the three crystal signals is gated as a reference to the Phase-Locked Loop Oscillators (PLO) 50, 52, 54. The PLO is any suitable synthesizing function, and could be analog or a fully digital implementation. The phase-locked loop oscillators phase lock their output signal to the selected crystal input signal. Each of the PLOs 50, 52, 54 are independent and therefore simply provide redundant functionality.

Thereafter, majority voting circuits 60, 62, 64 vote on the signals from the phase locked loop oscillators 50, 52, 54. The purpose of the output voting stage 60, 62, 64 is to deliver a signal to the output driver. The majority voting circuits 60, 62, 64 protect against the failure of one of the PLOs 50, 52, 54 and against one of the selectors 40, 42, 44 malfunctioning and thereby providing a PLO 50, 52, 54 with the incorrect reference oscillator signal. Conceptually, a simple 2-And, 3-Or operation may be performed on the PLO signals to achieve this function. The availability of the function can be improved by putting simple instrumentation on the PLO output signals so that if a failure is detected forcing a logic pattern that improves the selection process. For example, if one failure is detected, the output may be forced to be '0'. If a second failure is detected, the output may be forced to be '1'. Thus, only one of the PLO signals needs to be present at a voter 60, 62, 64 input to propagate a signal to the drivers 70, 72, 74.

Finally, each output signal from the majority voting circuits 60, 62, 64 is then routed to a driver bank 70, 72, 74. Each customer card 16 then receives three signals from the voter output banks 70, 72, 74, and votes 80 the three signals to create the local card clock 90. Thus, no two crystal oscillators, or five receivers, or two PLOs; or no one voter, driver, wire, connector, or card receiver could stop the delivery of the clock to any customer card 16. So long as power is delivered to the clock chip and a power short circuit on the chip does not destroy the entire chip, the clock signals will be delivered.

Figure 2:
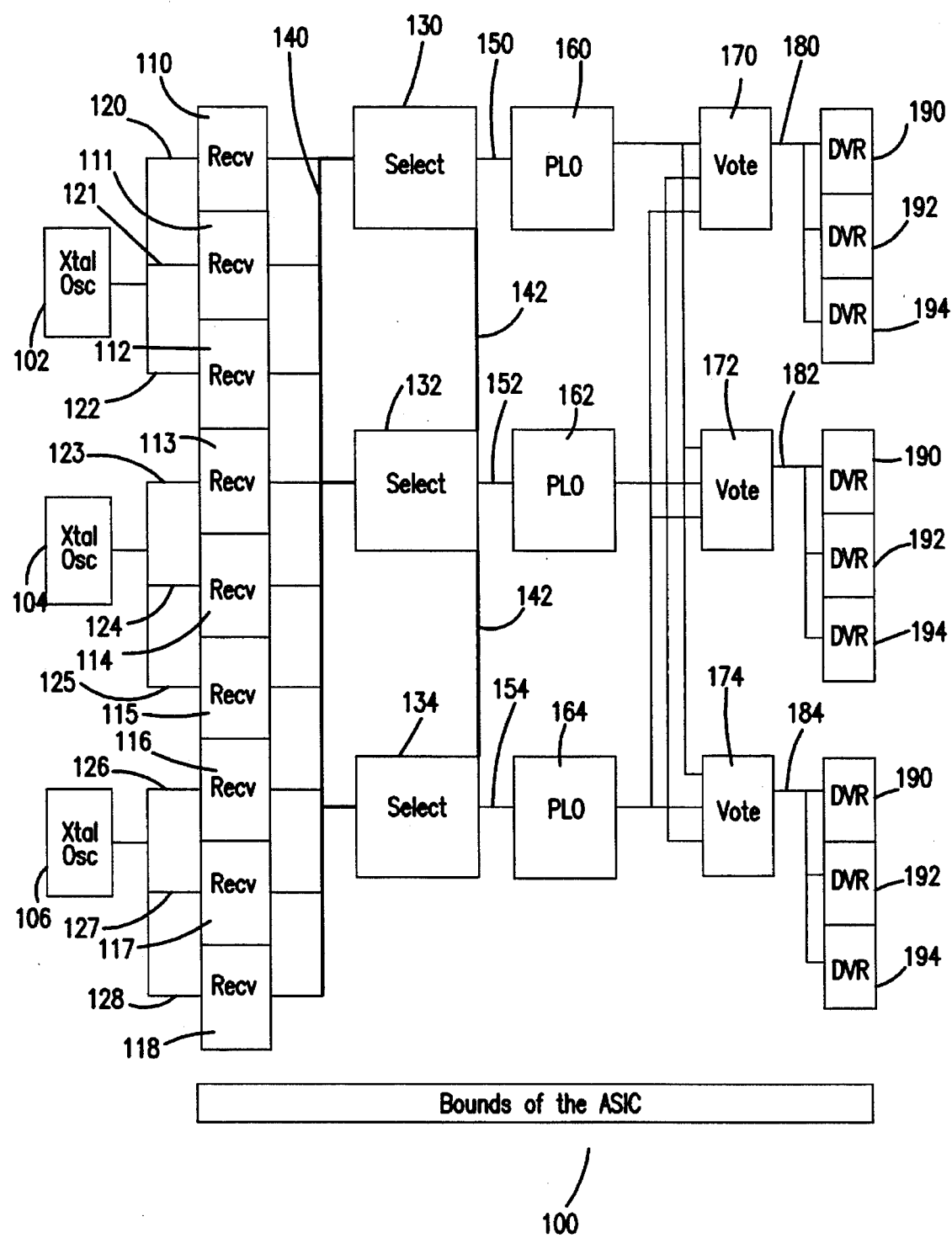
FIG. 2 illustrates the functional details of the ASIC structure.

FIG. 2 illustrates further details of the ASIC structure 100 including the functional blocks and all pertinent signals between the blocks. FIG. 2 depicts three signals from each of three crystal oscillators 102, 104, 106 being received on the ASIC. Nine receivers 110–118 receive the nine oscillator signals 120–128. The nine received oscillator signals are delivered to each of the three select logic blocks 130, 132, 134. The details of the select blocks 130, 132, 134 are described in more detail with reference to FIG. 3 below. The vertical bars 140, 142 indicate that the selected signals are shared and then voted with the other select blocks prior to actually gating the clock signals.

The outputs 150, 152, 154 of the Select blocks 130, 132, 134 are the oscillator signals, which are each delivered to its unique phase-locked loop oscillator 160, 162, 164. The PLOs 160, 162, 164 provide a flywheel effect in the event of the need to shift to a different crystal oscillator 102, 104, 106, and an opportunity to change frequency through a synthesis procedure. In effect, the PLOs 160, 162, 164 act as a high inertia flywheel to smooth out any glitch caused by any asynchronous switching between clock signals when a failure occurs.

The output of each PLO 160, 162, 164 is delivered to each of the three output voting blocks 170, 172, 174, which results in three independent views 180, 182, 184 of what is a valid output clock. The three output clock signals are then driven off chip as many times as needed to satisfy the number of system member cards in the system. FIG. 2 illustrates three drivers 190, 192, 194 for each output 180, 182, 184 from the voting blocks 170, 172, 174.

Figure 3:
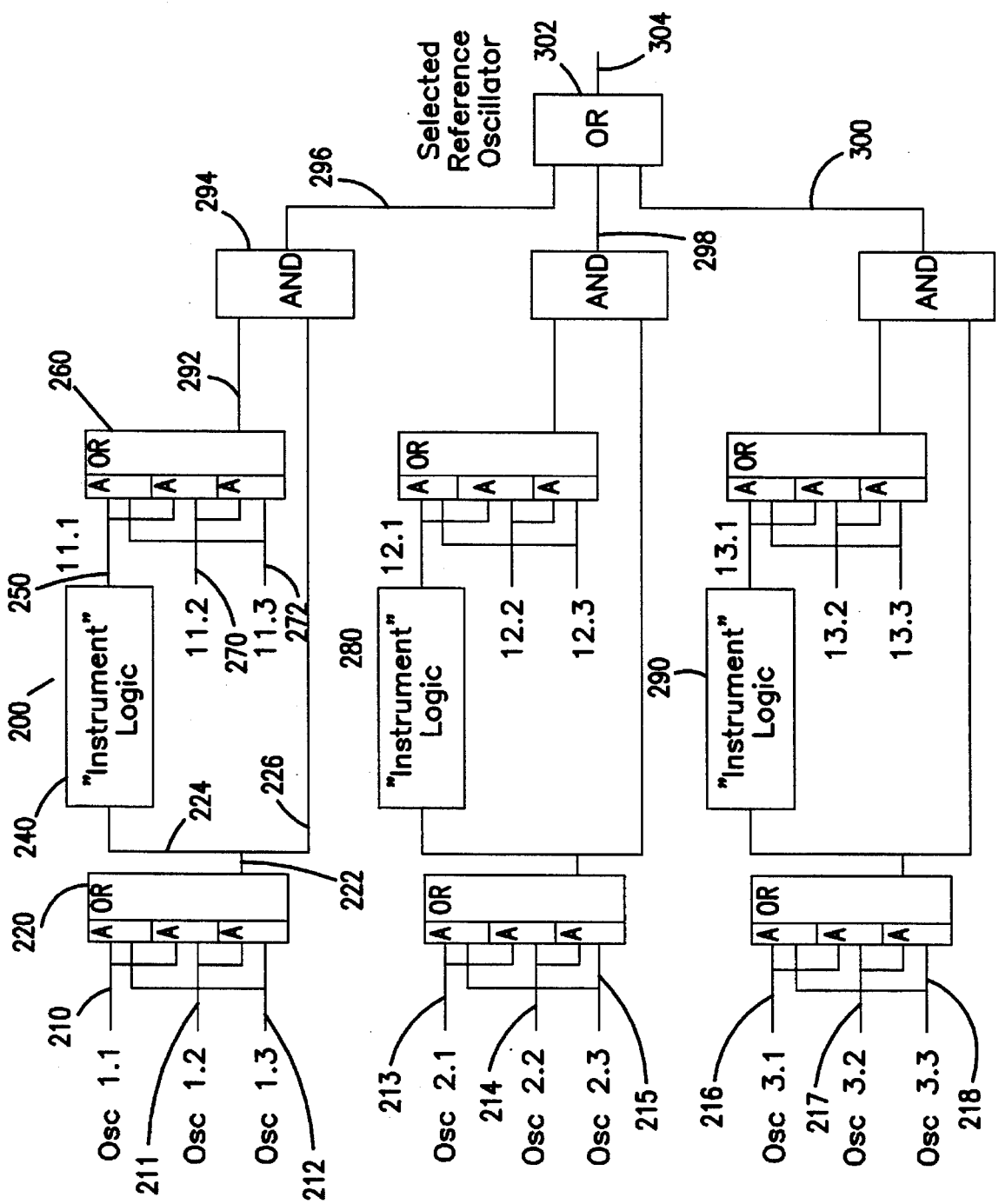
FIG. 3 illustrates in more detail an embodiment for a select blocks as illustrated in FIG. 2.

Now referring to FIG. 3, one of several possible implementations of one of the select blocks 200 is illustrated. All nine received signals from the three crystal oscillators are brought into a select block 210–218, and majority logic 220 performed on each group of three. The output 222 of a "voted" oscillator is split into two signals 224, 226. The first signal 224 is then taken to an instrument logic group 240 that performs a measurement on the oscillator signal 224 to judge its suitability for use. For example, a simple NAND INVERT chain, and parallel NOR INVERT chain, with an OR output will check that the oscillator is not stuck at a one or zero.

The output 250 of the instrument logic 240 is majority logic "voted" 260 with the output of the instrument logic in the other two selectors 270, 272, using the corresponding oscillator instrument. Note that signals from instrument logic 240, 280, 290 are provided to the other select blocks (not shown). This will insure that all three selectors agree on the "goodness" of the oscillators. The output 292 of majority logic voter 260 and the second signal 226 are operated on by the AND gate 294 to produce an oscillator signal 296 based upon the first three oscillator signals 210, 211, 212. Similarly the second 213, 214, 215 and third 216, 217, 28 group of three signals are used to generate oscillator signals 298, 300. These are then voted 302 with the signal 296 from AND gate 294 to obtain the PLO reference oscillator 304. Identical priority logic in each selector 200 insures that the same oscillator is selected for the PLO reference.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An ultra high availability clock for use by multiple card assemblies, comprising:

a plurality of crystal oscillators for providing a plurality of clock signals;

a plurality of receivers, coupled to the crystal oscillators, each receiver receiving a clock signal from a crystal oscillator;

a plurality of selection means, redundantly coupled to each receiver, each selection means selecting one of the clock signals received by the receivers as a reference oscillator signal;

a plurality of phase locking means, a phase locking means being coupled to each selection means, the phase locking means receiving a selected reference oscillator signal from a selection means and providing a phase-locked clock signal in response thereto, the phase-locked clock signal being phase-locked to the input reference oscillator signal; and at least one majority logic voting means, redundantly coupled to each phase locking means, for providing a clock output signal reflecting the state of the majority of the phase-locked clock signals.

2. The clock of claim 1 further comprising at least one driver means coupled to a majority logic voting means for receiving the clock output signal and providing three synchronized clock signals to a card assembly in response thereto.

3. The clock of claim 2 further comprising a majority voter interface, coupled between the card assembly and the driver means, the majority voter interface receiving the three synchronized clock signals from the driver means and providing a local card clock signal for the card assembly.

4. The clock of claim 1 wherein the plurality of crystal oscillators comprise three crystal oscillators.

5. The clock of claim 4 wherein each crystal oscillator provides three synchronized clock signals.

6. The clock of claim 5 wherein the plurality of receivers comprise nine receivers, each of the nine receivers receiving a synchronized clock signal.

7. The clock of claim 1 wherein the plurality of crystal oscillators comprise three crystal oscillators, each oscillator providing three synchronized clock signals and each synchronized clock signal being received by a receiver, each receiver outputting an oscillator signal, and wherein the selection means comprises three substantially identical subcircuits, each subcircuit further comprising:

a voter, coupled to the receivers, the voter accepting the oscillator signal and providing a voted clock output signal reflecting the state of the majority of the oscillator signals;

instrument logic means, coupled to the voter, for receiving the voted clock output signal, detecting a failure of the voted clock output signal and providing an instrument logic output signal in response thereto;

agreement determining means, coupled to the instrument logic means, for receiving its own instrument logic signal and instrument logic signals from the other two subcircuits, the agreement determining means providing an agreement oscillator signal in response thereto.

8. The clock of claim 7 wherein the selection means further comprises reference oscillator selection means, coupled to an agreement determining means and a voter from each subcircuit, for receiving the agreement oscillator signals from the agreement determining means and for receiving a voted clock output signal from the voters, the reference oscillator selection means providing a reference oscillator signal to the phase locking means in response thereto.

9. A non-interruptable Application Specific Integrated Circuit (ASIC) clock system for use by multiple card assemblies, comprising:

a plurality of receivers for receiving a synchronized clock signal and providing an oscillator signal;

a plurality of selection means, redundantly coupled to the receivers, each selection means selecting one of the oscillator signals;

a plurality of phase locking means, a phase locking means being coupled to each selection means and receiving the selected oscillator signal from a selection means, the phase locking means and providing an output signal in response thereto, the output signal being phase-locked to the input oscillator signal;

at least one majority logic voting means, redundantly coupled to each phase locking means, for providing a clock output signal reflecting the state of the majority of the phase-locked output signals; and at least one driver means, coupled to a majority logic voting means, for receiving the clock output signal and providing three synchronized clock signals to a card assembly in response thereto.

10. The clock of claim 9 further comprising a voter interface, coupled between the card assembly and the driver means, the voter interface receiving the three synchronized clock signals from the driver means and providing a local card clock signal for the card assembly in response to the voting of the three clock signals.

11. The clock of claim 9 wherein the plurality of crystal oscillators comprise three crystal oscillators.

12. The clock of claim 11 wherein each crystal oscillator provides three synchronized clock signals.

13. The clock of claim 12 wherein the plurality of receivers comprise nine receivers, each of the nine receivers receiving a synchronized clock signal.

14. The clock of claim 9 wherein the selection means comprises three substantially identical subcircuits, each subcircuit further comprising:

a voter, coupled to the receivers, the voter accepting the oscillator signal from the receivers and providing a voted clock output signal reflecting the state of the majority of the oscillator signals;

instrument logic means, coupled to the voter, for receiving the voted clock output signal, detecting a failure of the voted clock output signal and providing an instrument logic output signal in response thereto;

agreement determining means, coupled to the instrument logic means, for receiving its own instrument logic signal and instrument logic signals from the other two subcircuits, the agreement determining means providing an agreement oscillator signal in response thereto; and reference oscillator selection means, coupled to an agreement determining means for receiving the agreement oscillator signals therefrom and a voter for receiving a voted clock output signal, the reference oscillator selection means providing a reference oscillator signal to the phase locking means in response thereto.

15. A method of providing a non-interruptable clock signal to multiple card assemblies, comprising the steps of:

providing a plurality of clock signals;

redundantly coupling the clock signals to a plurality of selection means;

selecting and outputting one of the redundantly coupled clock signals as a reference oscillator signal from each selection means;

providing a selected reference oscillator signal to a plurality of phase-locked loop oscillators;

phase-locking each of the reference oscillator signals;

redundantly coupling the phased-locked reference oscillator signals to a majority voter;

voting the redundant phased-locked reference signals to provide a clock output signal reflecting the state of the redundantly coupled phase-locked reference oscillator signals.

16. The method of claim 15 further comprising the step of driving the clock output signal to a card assembly, the step of driving the clock output signal to a card assembly further comprises the step of providing three clock signals to the card assembly.

17. The method of claim 16 further comprising the step of receiving the three clock signals from the driver means and voting the three clock signals to provide a local card clock signal for the card assembly.

18. The clock of claim 15 wherein the step of selecting one of the redundantly coupled clock signals as a reference oscillator signal further comprises the steps of:

accepting the redundantly coupled synchronized clock signals and voting the redundantly coupled synchronized clock signals to provide a majority clock output signal reflecting the state of the majority of the redundantly coupled synchronized clock signals;

receiving the majority clock output signal;

providing an instrument logic output signal in response to the receipt of the majority clock output signal;

receiving the instrument logic output signals and the majority clock output signals;

providing a reference oscillator signal in response to the receipt of the instrument logic output signals and the majority clock output signals.

* * * * *

UNITED STATES PATENT AND TRADEMARK OFFICE
CERTIFICATE OF CORRECTION

PATENT NO. : 5,568,097

DATED : October 22, 1996

INVENTOR(S) : Woodman, Jr.

It is certified that error appears in the above-identified patent and that said Letters Patent is hereby corrected as shown below:

In column 3, line 21, delete "one" and insert --One--.

In column 4, line 27, insert --,-- after the words "In fact".

In column 5, line 42, insert --is-- before the word "performed".

Signed and Sealed this

Fifth Day of August, 1997

Attest:

BRUCE LEHMAN

Attesting Officer

Commissioner of Patents and Trademarks